(12) United States Patent  
Feng et al.

(10) Patent No.: US 7,719,276 B2
(45) Date of Patent: May 18, 2010

(54) CERVICAL-THORACIC-LUMBAR SPINE PHASED ARRAY COIL FOR MAGNETIC RESONANCE IMAGING

(75) Inventors: Limin Feng, Streetsboro, OH (US); Karthik Lakshmanan, Streetsboro, OH (US); Vincent W. Chen, Aurora, OH (US); Jacob J. Sladkey, Burton, OH (US)

(73) Assignee: General Electric Company, Schenectady, NY (US)

( * ) Notice: Subject to any disclaimer, the term of this patent is extended or adjusted under 35 U.S.C. 154(b) by 52 days.

(21) Appl. No.: 10/993,246

(22) Filed: Nov. 19, 2004

(65) Prior Publication Data

US 2005/0122110 A1 Jun. 9, 2005

Related U.S. Application Data

(60) Provisional application No. 60/523,657, filed on Nov. 19, 2003.

(51) Int. Cl.
*G01V 3/00* (2006.01)
(52) U.S. Cl. ........................................ 324/318; 324/309
(58) Field of Classification Search ......... 324/300–322; 600/407–445
See application file for complete search history.

(56) References Cited

U.S. PATENT DOCUMENTS

| | | | | | |
|---|---|---|---|---|---|
| 5,500,596 | A | * | 3/1996 | Grist et al. | 324/318 |
| 5,664,568 | A | * | 9/1997 | Srinivasan et al. | 600/422 |
| 6,289,232 | B1 | * | 9/2001 | Jakob et al. | 600/410 |
| 6,414,485 | B1 | * | 7/2002 | Kato et al. | 324/307 |
| 6,441,612 | B1 | * | 8/2002 | Shimo et al. | 324/309 |
| 6,577,888 | B1 | * | 6/2003 | Chan et al. | 600/422 |
| 6,624,633 | B1 | * | 9/2003 | Zou et al. | 324/318 |
| 6,701,177 | B2 | * | 3/2004 | Su | 600/422 |
| 6,879,159 | B2 | * | 4/2005 | Yoshida | 324/318 |
| 6,914,432 | B2 | * | 7/2005 | Dumoulin et al. | 324/318 |
| 6,930,481 | B2 | * | 8/2005 | Okamoto et al. | 324/318 |
| 6,980,002 | B1 | * | 12/2005 | Petropoulos et al. | 600/422 |
| 2003/0132750 | A1 | * | 7/2003 | Machida et al. | 324/322 |
| 2003/0184294 | A1 | * | 10/2003 | Boskamp et al. | 324/318 |
| 2004/0196042 | A1 | * | 10/2004 | Fujita et al. | 324/318 |
| 2005/0107686 | A1 | * | 5/2005 | Chan et al. | 600/422 |
| 2008/0231279 | A1 | * | 9/2008 | Iwadate | 324/318 |

* cited by examiner

*Primary Examiner*—Brij B Shrivastav
(74) *Attorney, Agent, or Firm*—Dean Small; Small Patent Law Group

(57) ABSTRACT

A phased array coil for a Magnetic Resonance Imaging (MRI) system is provided that includes a first coil, a second coil adjacent the first coil, and a third coil adjacent the second coil. The first, second and third coils are configured in a parallel arrangement in a left-right direction of the MRI system.

17 Claims, 5 Drawing Sheets

CERVICAL-THORACIC-LUMBAR SPINE PHASED ARRAY COIL FOR MAGNETIC RESONANCE IMAGING

CROSS REFERENCE TO RELATED APPLICATIONS

This application claims priority to and the benefit of the filing date of U.S. Provisional Application No. 60/523,657, filed on Nov. 19, 2003 and which is hereby incorporated by reference in its entirety.

BACKGROUND OF THE INVENTION

This invention relates generally to medical imaging systems, and more particularly, to a phased array coil for a Magnetic Resonance Imaging (MRI) system.

MRI or Nuclear Magnetic Resonance (NMR) imaging generally provides for the spatial discrimination of resonant interactions between Radio Frequency (RF) waves and nuclei in a magnetic field. NMR signals are typically detected using a receive RF coil, which is placed in the vicinity of a volume excited by the magnet system of the MRI or NMR scanner.

It is known to use a phased array configuration for RF coils in MRI to receive NMR signals. For example, a phased array surface coil for horizontal field MRI systems may include a surface phased array having multiple loop element coils. Any two adjacent loop elements typically have physical overlap in order to provide isolation. The multiple loop elements can be arranged, for example, in one row or in a triangle shape array.

Typically, a set of surface coil loops are critically decoupled relative to each other and simultaneously receive the NMR signal that is generated in the imaging region that is excited by a dedicated volume coil. The signal from these surface coils is then reconstructed to generate an image that is multiple times larger than the size of each individual loop in the array. Because the size of each element in the phased array is relatively small compared with the final reconstructed image, the noise figure is reduced and the signal obtained from each element of the phased array is increased. Thus, the final result is a significant increase in SNR for the final reconstructed image. The first application of such a phased array design was intended for the spine region because the required coverage of the spine area for the human body is extremely large and a single receive coil structure could not adequately provide the image necessary for clinical evaluation.

The use of these phased array coil structures, for example, a row of square loop coils for spine scanning when the coils are lined up in the head-foot (HF) direction, results in a shading problem with axial and coronal imaging. When a loop coil is used to scan the human body in a 3 T or higher field strength system, the sensitivity map of the coil in the transverse plane that is perpendicular to the main field direction of the system is not symmetrical. If the main field directs from the back of magnet to the front (patient end), the sensitivity map of the loop coil, which is put under the human body, tilts to left side (on the transverse plane, not the left side of the human body). If the main field direction reverses, the sensitivity map tilts to right side. Thus, if the left-right center of this phased array is positioned to the center of the spine, the coil does not provide the best SNR in the spine region because the coil sensitivity tilts to one side. The signals received from the right and left side of the spine are not symmetrically equal. The intensity difference between the signals from two symmetrical point on the left and right side of the spine can be more than twenty percent. This causes the transverse and coronal images of the coil to have obvious left-right shading.

Other variations use a two-dimension phased array surface coil structure having circular-shaped loop coils positioned adjacent loop coils at three apexes of an equilateral triangle. This structure is not suitable for spine imaging. When a phased array coil is used for spine imaging it should be able to scan any section of the spine. The coil should be made of several coil stations that are lined up in the HF direction. This triangle shape array is not suitable to make a spine coil with several coil sections in the HF direction.

Various modifications and deviations to the phased array coil were developed. For example, a phased array coil with figure "8" shaped element coils was developed and are which are commonly known as "butterflies." Instead of using a loop coil array, a quadrature coil array for spine imaging has also been provided. This coil is made of four quadrature pairs lined up in the HF direction with each quadrature pair having a loop and a butterfly element coil. This coil has several sections in the HF direction. Each section is made of one loop coil and a butterfly coil and they are quadrature analogically combined inside the coil or inside the MRI system. When a spine coil with this structure is used in 3 T system, the images generated by the coil also have left-right (LR) shading problems. This is because not only the loop coil, but also that butterfly coil has a tilted asymmetrical sensitivity map when used in a MRI system with 3T or higher main field. The sensitivity map of the butterfly coil is shifted to the same direction as the loop coil because the field inside the human body generated by the two wings of the butterfly coil are not symmetrical. The sensitivity map looks like two mountain peaks and the peak on the side to which the field tilts is higher than the other side. Thus, the signals received by the loop and butterfly coil quadrature analogically combined field still show an asymmetrical pattern. The best SNR area of this coil is not in the center where the spine lies, but shifts to one side. For example, one of the images on one side of the kidney is brighter than the other side.

Other coil arrays are also known that include six quadrature pairs. The six pairs are aligned in the HF direction to cover the whole Cervical-Thoracic-Lumbar (CTL) spine area. The first pair may be positioned on a former that is conformal to the human neck. The quadrature pairs can be used separately or jointly to image any desirable section of the spine. Two elements in each pair are either quadrature analogically combined or digitally combined depending on how many receive channels are in the MRI system.

In order to enhance the ability to image the CTL spine area, a phased array design was proposed that covered the intended area. The proposed design included six quadrature pairs (six loop and six saddle coils in a quadrature configuration) separated in a multiple list of modes in which the coil can operate and further can image any desirable section of the spine. These coils have six quadrature pairs lined up in HF direction. The first pair that covers the neck is put on the former with a conformal shape to the neck. The butterfly coil of this quadrature pair looks more like a saddle coil. All the quadrature pairs in coils are either analogically combined inside the coil or digitally combined in the system. The sensitivity map of a saddle coil also has an asymmetrical pattern. Because both two element coils of a quadrature pair have asymmetrical sensitivity, the digitally combined images still have the LR shading problem. Thus, when a coil with this structure is used in a system with 3 T or higher main field, it still has the left and right shading problem no matter whether it is analogically combined or digitally combined. An alternative embodiment is to use twelve elements independently or in any receiver configuration based on the MRI system. This system still has the LR shading problem.

Thus, in operation, when a surface coil (e.g., a loop coil) is used in high field MRI systems whose main magnetic field strength is 1.5 Tesla (T) or higher, an asymmetrical signal sensitivity of the coil is observed. Even though the loop coil has a symmetrical structure, the sensitivity map of the coil tilts to one side. The tilting direction is related to the direction of the main magnetic field. This phenomenon is more obvious in a system that has the main magnetic field strength equal or higher than 3 T. This phenomenon is caused by the dielectric and conductive effect of the human body on the high RF frequency electromagnetic field. The RF electromagnetic field generated by nuclei resonant spins inside the body is a circular polarized field and propagates inside the body because the electromagnetic wavelength inside the body is not much larger than the dimension of the body at high RF frequency. The MR signals received by the coil from the left and the right side are no longer equal because of propagation of the circular polarized field generated by nuclei resonant spins.

When a traditional spine coil (e.g., CTL coil) with the quadrature structure described above is used in a 3 T system, the coil sensitivity map is tilted to one side. For example, on transverse and coronal spine images, the signals of tissues on the left and right sides of the spine are not equal. The difference of the signal intensity on the two sides can cause LR shading on the transverse and coronal spine images. This is known as LR shading problem for spine imaging with the traditional CTL coil. This problem may result in an improper or failed diagnosis.

Further developments in MRI include Simultaneous Acquisition of Spatial Harmonics (SMASH) that use a parallel processing algorithm to exploit spatial information inherent in a surface coil array. The result is an increase in MR image acquisition speed, resolution and/or field of view. In a similar fashion, another parallel processing algorithm is known where the acceleration of image acquisition is performed on the time domain space instead of the frequency domain space. This parallel acquisition technique is referred to as Sensitivity Encoding (SENSE). In SENSE, images are obtained by means of magnetic resonance (MR) of an object placed in a static magnetic field and includes simultaneous measurement of a number of sets of MR signals by application gradients and an array of receiver coils. Reconstruction may bee provided from a number of receiver coil images from the sets of MR signals measured and/or reconstruction of a final image may be from a distant dependent sensitivity of the receiver coils and a first plurality of receiver coil images.

The characteristics of all of these parallel imaging techniques is that the acceleration speed is directly proportional to the number of independent receivers along the direction that the image acceleration needs to be applied. Thus, the higher the number of receiver coils, the faster the acceleration speed for acquiring an image with better SNR and improved image quality.

However, if the phased array surface coil has one row of square loop coils, it only has parallel imaging capability in the HF direction. Further, the quadrature phased arrays described above also only have parallel imaging capability in the HF direction. The two element coils of a quadrature pair in these coils have a large common coverage in the LR direction. The g-factor values for such a quadrature coil are severely elevated because the $B_1$ field profile for these two element coils is nearly indistinguishable around the spine region. Thus, they have no parallel imaging capability in the LF direction.

BRIEF DESCRIPTION OF THE INVENTION

In an exemplary embodiment, a phased array coil for a Magnetic Resonance Imaging (MRI) system is provided that includes a first coil, a second coil adjacent the first coil, and a third coil adjacent the second coil. The first, second and third coils are configured in a parallel arrangement in a left-right direction of the MRI system.

In another exemplary embodiment, a cervical-thoracic-lumbar (CTL) spine phased array coil for a Magnetic Resonance Imaging (MRI) system is provided that includes a plurality of coil sections aligned in a head-foot direction of the MRI system. Each of the coil sections includes three coils configured in a parallel arrangement in a left-right direction of the MRI system.

In yet another exemplary embodiment, a method of providing a phased array coil for a Magnetic Resonance Imaging (MRI) system is provided. The method includes configuring three coils in each of a plurality of coil sections in a parallel arrangement in a left-right direction of the MRI system. The method further includes aligning the coil sections in a head-foot direction of the MRI system.

DETAILED DESCRIPTION OF THE INVENTION

Various embodiments of the present invention provide a phased array coil for imaging, for example, the Cervical-Thoracic-Lumbar (CTL) spine of the human body using a Magnetic Resonance Imaging (MRI) system. The various embodiments may be used in a horizontal MRI system with, for example, a 3-Telsa (3 T) main magnetic field strength. However, the various embodiments may be used in MRI systems having a lower or greater main magnetic field strength. Due to the human body's dielectric and conductive effect on the high frequency electromagnetic field, an RF coil with a symmetrical structure receives asymmetrical signals from the body. This causes, for example, spine images made by a traditional CTL coil, which has a symmetrical quadrature pair structure, to have left-right (LR) shading. Various embodiments of the invention provide a three-loop coil structure to provide a wide uniform sensitivity area with a high SNR in the LR direction to cover the spine and nearby tissue regardless of the direction of the main magnetic field of the MRI system. The various embodiments also provide a coil array having parallel imaging capability with phase encoding in the LR direction.

Figure 1:
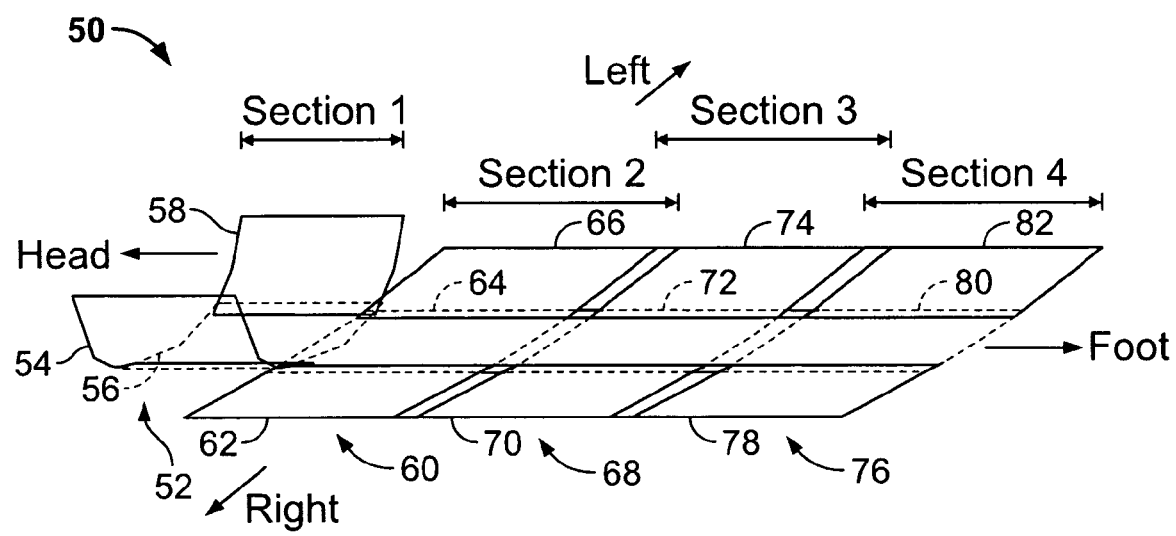
FIG. 1 is a schematic representation of a phased array coil in accordance with an exemplary embodiment of the invention.
Figure 2:
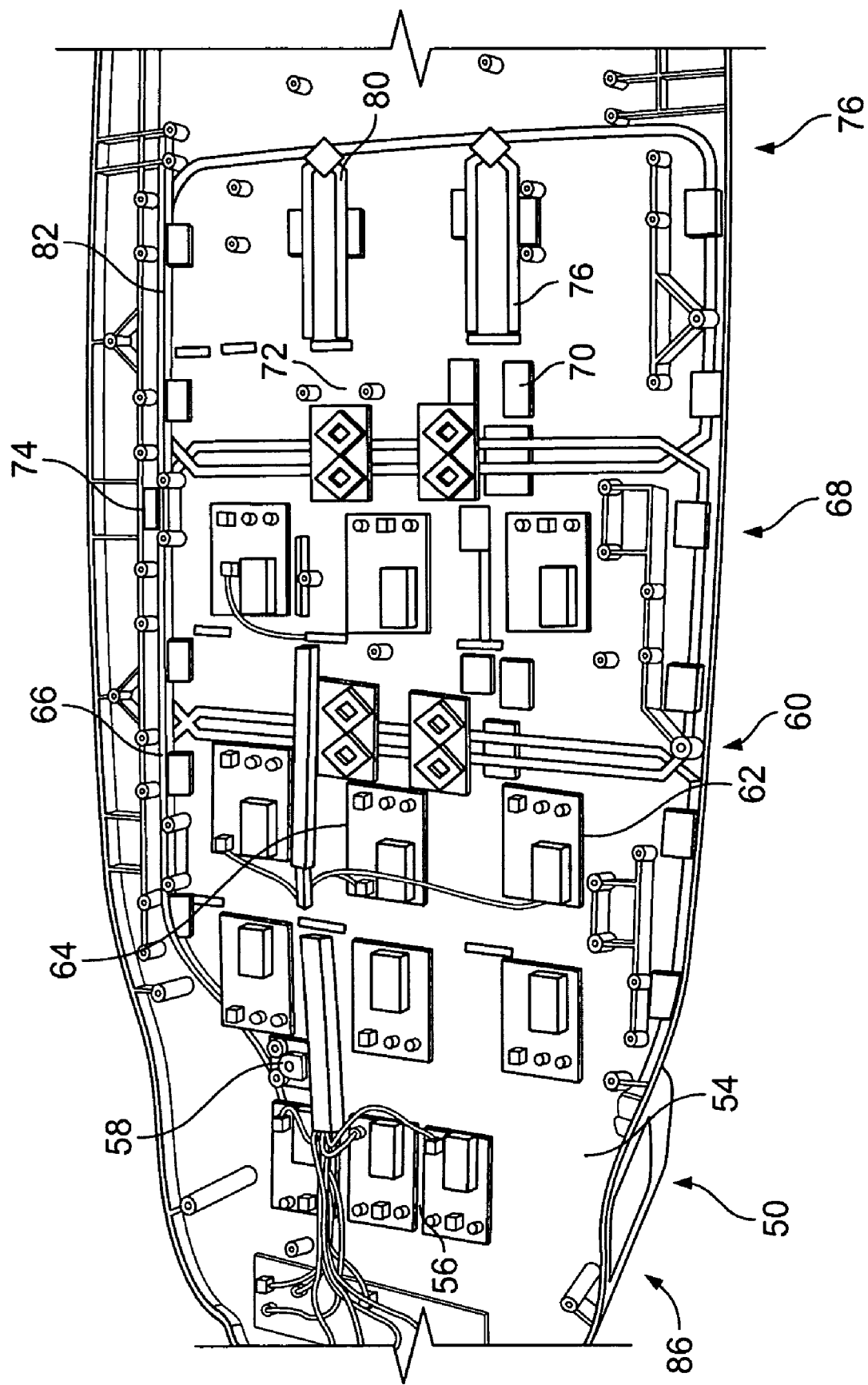
FIG. 2 is a perspective view of a phased array coil within a posterior former in accordance with an exemplary embodiment of the invention.

More particularly, and as shown in FIG. 1, in an exemplary embodiment, a phased array coil 50, for example, a CTL phased array coil, generally includes a plurality of coil elements, such as, twelve loop coil elements arranged in four sections aligned in the head-foot (HF) direction. For example, the four sections in one exemplary embodiment are aligned longitudinally for imaging along a spine of a patient. Specifically, each coil section includes three parallel loop elements in the LR direction, and in an exemplary embodiment, the phased array coil 50 includes a first coil section 52, which may be positioned toward a patient's head, and that includes a first loop coil 54, a second loop coil 56 and a third loop coil 58. A second coil section 60 adjacent the first coil section 52 includes a fourth loop coil 62, a fifth loop coil 64 and sixth loop coil 66. A third coil section 68 adjacent the second coil section 60 includes a seventh loop coil 70, an eighth loop coil 72 and a ninth loop coil 74. A fourth coil section 76 adjacent the third coil section 68, and which may be positioned toward a patient's feet, includes a tenth loop coil 78, an eleventh loop coil 80 and an twelfth loop coil 82. The two loop coils in each of the coil sections 52, 60, 68 and 76 are configured in a parallel arrangement positioned in the left-right (LR) direction. It should be noted that the first, second and third loop coils 54, 56 and 58 forming the first coil section 52 may be configured to be conformal to the shape of a neck and head of, for example, a patient to be scanned. Further, the coil sections 52, 60, 68 and 76 may be provided, for example, as part of a posterior former 86 as shown in FIG. 2.

The loop coils in each coil section 52, 60, 68 and 76 are overlapped to provide isolation between the two coil elements (e.g., adjacent coil elements), but also provide a wide uniform field in LR direction and high SNR. In operation, a coil with non-overlapping loop elements has low g factors, which is good for parallel imaging. However, the sensitivity map combined from two non-overlapping loop elements has a dip in the middle between the two loop elements and causes low SNR in that area. Thus, the sensitivity map combined from three non-overlapping loop elements has two dips in the LR direction and is not symmetrical in the LR direction because of the asymmetrical sensitivity map of each loop coil. However, the sensitivity map combined from three overlapping two loop elements is flat in a wide area.

Figure 3:
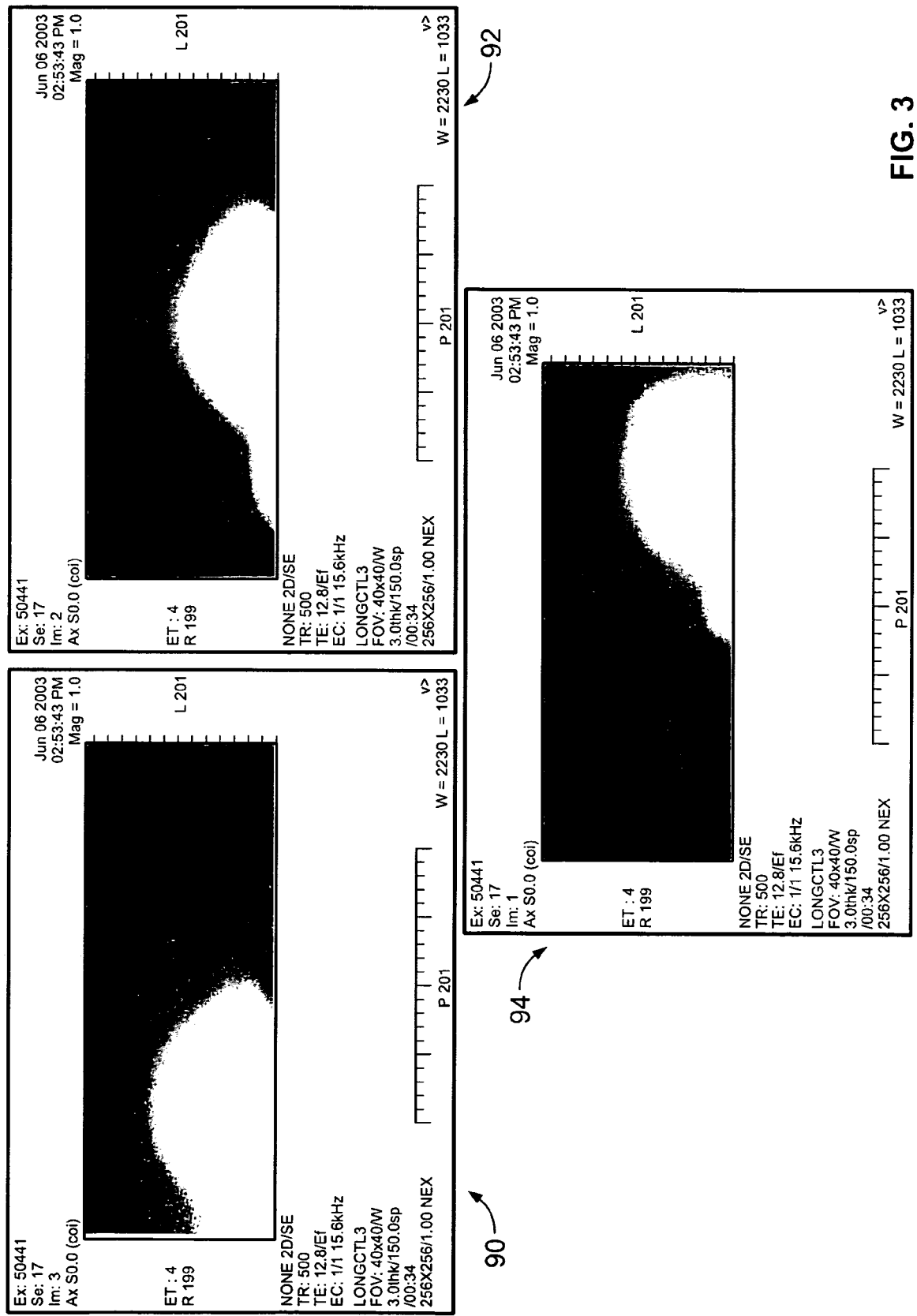
FIG. 3 are images of a sensitivity map for loop coils showing a tilted image.
Figure 4:
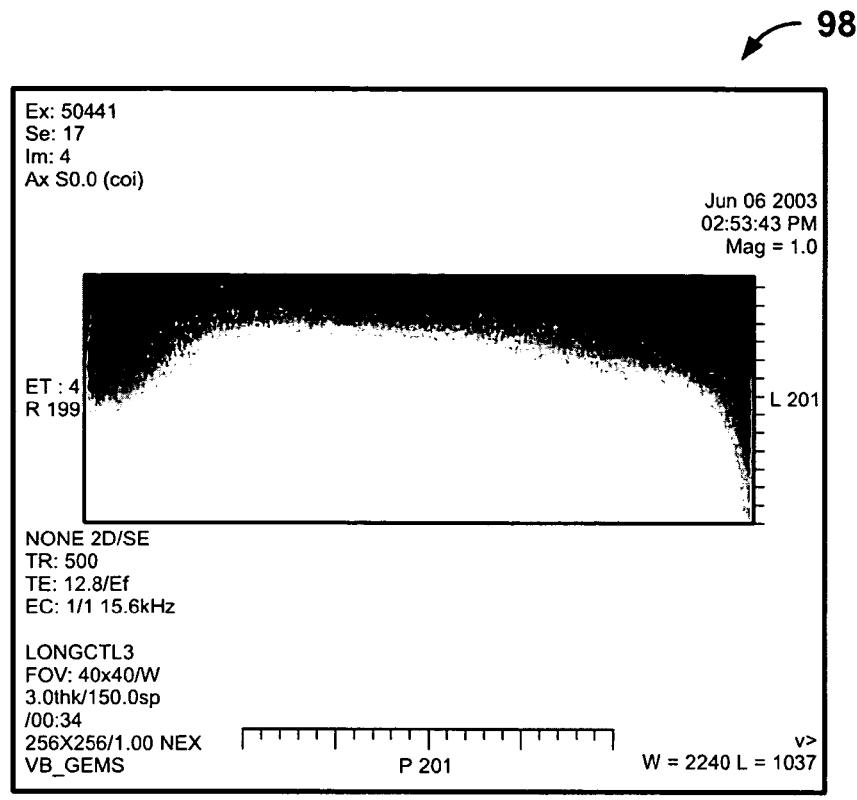
FIG. 4 is an image of a combined sensitivity map for loop coils showing a tilted image.

For example, sensitivity maps 90, 92 and 94, corresponding to left, middle and right loop coils, respectively, is shown by the phantom images of the single loop coils in FIG. 3. FIG. 4 is a combined sensitivity map 98 of three loop coils shown by the phantom image of the three loop coils. Because the sensitivity maps 90, 92 and 94 of the single loop elements are tilted, the sensitivity map 98 combined from three loop elements is still tilted. However, the uniformity in the sensitivity area in the LR direction is wide enough to cover the spine and nearby tissue.

Adjacent coil sections 52, 60, 68 and 76 are also overlapped in order to provide isolation between adjacent loop coils in the coil sections 52, 60, 68 and 76. Because the magnetic field in the Z direction of the loop coils does not receive an MR signal, there is a dip middle of two adjacent sections on the sagittal sensitivity map of the coil. Overlapping coil sections can decrease the dip, thus increasing SNR in the middle of two adjacent sections.

The phased array coil 50 may be used, for example, in connection with an MRI system having six or more receive channels. In operation, the first and second coil sections 52 and 60 may be used to the scan the cervical spine (C-spine) and part of the thoracic spine (T-spine). The second and third coil sections 60 and 68 may be used to scan the T-spine. The third and fourth coil sections 68 and 76 may be used to scan the lumbar (L-spine) and a part of T-spine. It should be noted that any of the coil sections 52, 60, 68 and 76 also may be used to scan a small specific part of the spine. In operation, three loop coils of each section 52, 60, 68 or 76 are used at the same time in order to provide uniform and symmetrical images in the LR direction. Each loop element also may be digitally combined with other loop elements inside the MRI system as is known.

Figure 5:
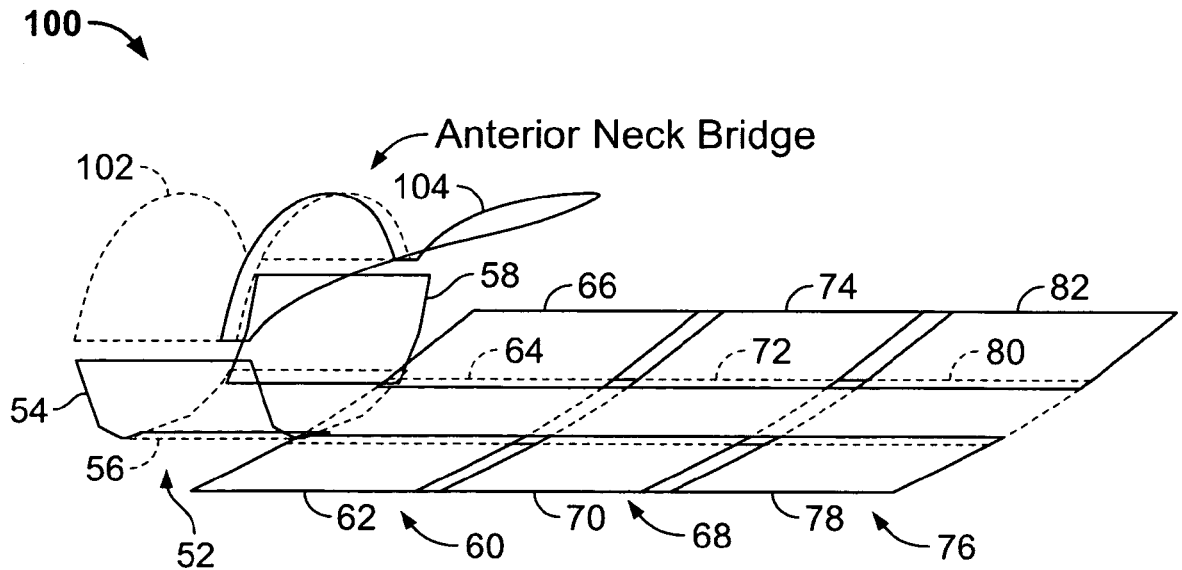
FIG. 5 is a schematic representation of a phased array coil in accordance with another exemplary embodiment of the invention.

Different phased array coils may be provided by various embodiments of the invention. In another exemplary embodiment, as shown in FIG. 5, a phased array coil 100 with fourteen loop coils is provided. The phased array coil 100 includes the twelve loop coils similar to the a phased array coil 50, which may be provided, for example, on a posterior former, and with the addition of two loop coils 102 and 104 on a neck bridge (not shown). The loop coils 102 and 104 enhance penetration in the C-spine area. The phased array coil 100 also may be used in connection with an eight channel MRI system. In such as system, the two loop coils 102 and 104 on the neck bridge may be used jointly for C-spine scanning.

Figure 6:
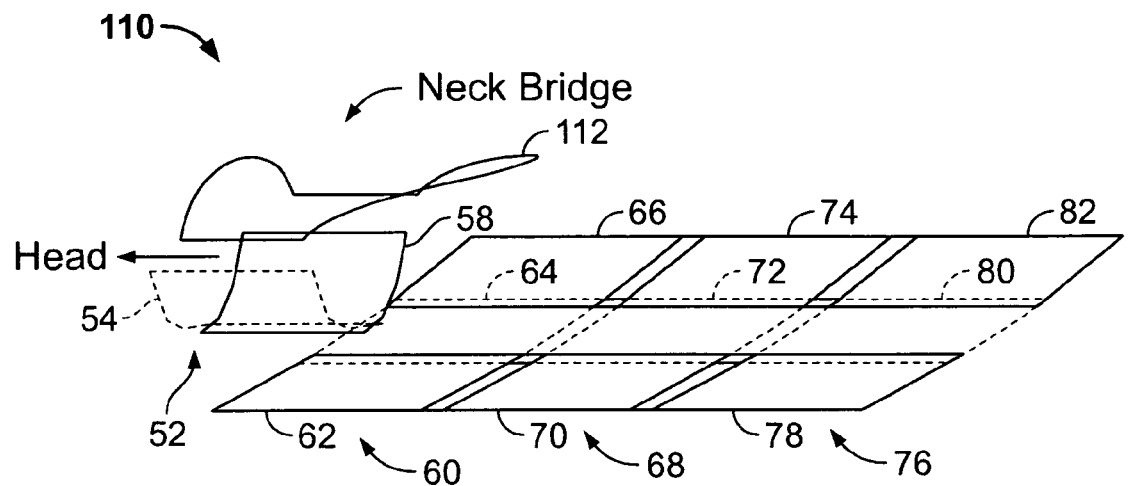
FIG. 6 is a schematic representation of a phased array coil in accordance with another exemplary embodiment of the invention.

In another exemplary embodiment, as shown in FIG. 6, a phased array coil 110 with eleven loop coils, for example, on the posterior former and one loop coil on the bridge, is provided. This phased array coil 110 is similar to the phased array coil 50, but does not include the second loop coil 56 in the first coil section 52 and includes an additional loop coil 112 on the neck bridge (not shown). The phased array coil 110 may be used in connection with an MRI system having six or more receive channels. In such as system, the two coil sections 52 and 60 may be used jointly for C-spine scanning.

Figure 7:
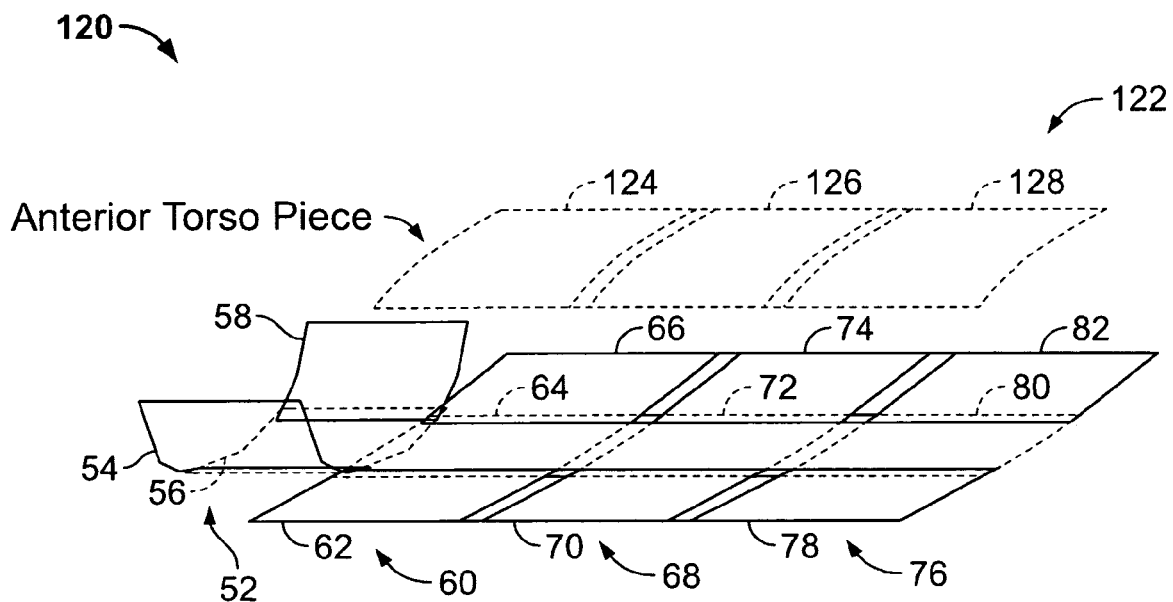
FIG. 7 is a schematic representation of a phased array coil in accordance with another exemplary embodiment of the invention.

Modifications to the various embodiments are contemplated. For example, the number of coil sections in the HF direction may be increased or decreased, as desired or needed, for example, based on the available number of receive channels of the MRI system in connection with which it is to be used. Further, and for example as shown in FIG. 7, a phased array coil 120 may include a torso piece 122 having three coil loops 124, 126 and 128 to enhance penetration and add parallel imaging capability with phase encoding in the AP direction.

It should be noted that the phased array coils of the various embodiments may be tuned and matched to different frequencies. In this case, the values of the tuning capacitors (not shown and as are known) will change. However, improved LR symmetry of coil sensitivity is still provided. Further, it should be noted that the feeding points of the coils can be placed in any location of the coil. Additionally, the matching of the coils may be provided via capacitive matching or inducting matching. Also, the resonating of the phased array coils of the various embodiments may be provided via direct feeding or inductive coupling. Depending on the MRI system, the phased array coils of the various embodiments may include pre-amplifiers.

Thus, various embodiments of the invention provides a wide uniform sensitivity area in the LR direction to cover the spine and nearby tissue. This uniform sensitivity area is provided regardless of the direction of the main magnetic field of the MRI system.

In operation, various embodiments of the invention provide acquired transverse and coronal images that are more symmetrical and uniform in the LR direction, for example, when used on 3 T or higher field MRI systems. High SNR in the spine area is also provided. Also, parallel imaging capability with phase encoding in the LR direction in addition to the HF direction may be provided.

Further, various embodiments of the present invention provide for positioning three parallel loop coils in the LR direction in order to provide a wide uniform sensitivity area with high SNR in the LR direction to cover the spine and nearby tissue. Also, three parallel loop coils may be positioned in the LR direction to make one section of the phased array coil, with several of these sections provided in the HF direction to construct a whole spine coil. Additionally, two parallel loop coils may be positioned in the LR direction around the neck and combined with several three-loop structure sections to construct a whole spine coil. Further, these arrangements may be combined with a neck bridge that includes one or two loop elements to provide a whole spine coil. An anterior torso piece having several loop elements also may be combined with these arrangements to provide a whole spine coil.

While the invention has been described in terms of various specific embodiments, those skilled in the art will recognize that the invention can be practiced with modification within the spirit and scope of the claims.

What is claimed is:

1. A phased array coil for a Magnetic Resonance Imaging (MRI) system, the phased-array coil comprising:
   a coil section having two coils configured in a parallel arrangement in a left-right direction relative to a longitudinal axis of the MRI system; and
   at least one additional coil section formed from at least:
      a first coil; a second coil adjacent the first coil; and a third coil adjacent the second coil, the first, second and third coils configured in a parallel arrangement in the left-right direction and wherein the first, second and third coils are further configured in an overlapping arrangement.

2. A phased array coil in accordance with claim 1 wherein the first, second and third coils comprise loop coils.

3. A phased array coil in accordance with claim 1 further comprising a plurality of additional coils configured to form a plurality of additional coil sections.

4. A phased array coil in accordance with claim 3 further comprising a torso piece.

5. A phased array coil in accordance with claim 4 wherein the torso piece comprises three coils aligned in the head-foot direction.

6. A phased array coil in accordance with claim 3 wherein the coil sections are configured to provide cervical-thoracic-lumbar (CTL) spine imaging with the MRI system.

7. A phased array coil in accordance with claim 3 wherein the additional coil sections each comprise three coils.

8. A phased array coil in accordance with claim 3 wherein the coil sections are aligned in a head-foot direction of the MRI system.

9. A phased array coil in accordance with claim 1 wherein the first, second and third coils are configured in a curved arrangement conformal to a shape of a neck and a head.

10. A phased array coil in accordance with claim 1 further comprising at least one neck bridge coil.

11. A phased array coil in accordance with claim 1 wherein the first, second and third coils are provided as part of a posterior former.

12. A cervical-thoracic-lumbar (CTL) spine phased array coil for a Magnetic Resonance Imaging (MRI) system, the CTL spine phased array coil comprising:
   a plurality of coil sections aligned in a head-foot direction of the MRI system and defining a posterior coil array, each of the coil sections comprising three coils configured in a parallel arrangement in a left-right direction relative to a longitudinal axis of the MRI system and the plurality of coil sections aligned longitudinally, wherein each of the coils overlap with adjacent coils; and a torso piece having three coils aligned in the head-foot direction and defining an anterior coil array.

13. A CTL spine phased array coil in accordance with claim 12 wherein one of the plurality of sections is configured in a curved arrangement conformal to a shape of a neck and a head.

14. A CTL spine phased array coil in accordance with claim 12 further comprising a coil section comprising two coils.

15. A CTL spine phased array coil in accordance with claim 12 further comprising at least one neck bridge coil.

16. A method of providing a phased array coil for a Magnetic Resonance Imaging (MRI) system, the method comprising:
   configuring three coils in each of a plurality of posterior coil sections in a parallel arrangement in a left-right direction relative to a longitudinal axis of the MRI system;
   aligning the coil sections in a head-foot direction of the MRI system; providing a torso piece having three coils aligned in the head-foot direction of the MRI system, the three coils of the torso piece each having a same size; and providing an anterior neck bridge having one loop coil conformal to a human neck and upper chest and wherein the posterior coil section opposite the one loop coil of the anterior neck bridge includes two parallel coils in the left-right direction that are conformal to a human neck.

17. A method in accordance with claim 16 further comprising configuring two coils in a parallel arrangement in the left-right direction of the MRI system to form a coil section.

* * * * *